US 6,653,672 B1

(12) United States Patent
Zheng

(10) Patent No.: US 6,653,672 B1
(45) Date of Patent: Nov. 25, 2003

(54) SEMICONDUCTOR DIE PAD PLACEMENT AND WIRE BOND

(75) Inventor: Hua Zheng, Fremont, CA (US)

(73) Assignee: Winbond Electronics Corp., San Jose, CA (US)

( * ) Notice: Subject to any disclaimer, the term of this patent is extended or adjusted under 35 U.S.C. 154(b) by 0 days.

(21) Appl. No.: 09/115,378

(22) Filed: Jul. 14, 1998

(51) Int. Cl.[7] ................................................ H01L 27/10
(52) U.S. Cl. ...................................... 257/208; 257/203
(58) Field of Search ............................. 257/786, 784, 257/666, 690, 692, 693, 737, 208, 203

(56) References Cited

U.S. PATENT DOCUMENTS

| | | | | |
|---|---|---|---|---|
| 5,093,712 A | * | 3/1992 | Matsunaga et al. | 257/786 |
| 5,208,782 A | * | 5/1993 | Sakuta et al. | 257/784 |
| 5,473,198 A | * | 12/1995 | Hagiya et al. | 257/686 |
| 5,604,710 A | * | 2/1997 | Tomishima et al. | 365/230.03 |
| 5,689,465 A | * | 11/1997 | Sukegawa et al. | 365/200 |
| 5,742,101 A | * | 4/1998 | Sakuta et al. | 257/786 |
| 5,907,166 A | * | 5/1999 | Casper et al. | 257/666 |

* cited by examiner

Primary Examiner—Phat X. Cao
(74) Attorney, Agent, or Firm—Dinh & Associates

(57) ABSTRACT

A semiconductor device is provided comprising a die. A first set of plural components, other than interface components, are located on the die surface. A first conductor located on the die surface connects to each component of the first set. A second set of plural components, other than said interface components, are located on the die surface. A second conductor located on the die surface connects to each component of the second set. A bonding pad is located on the die surface such that the first set of components lie between the bonding pad and an edge of the die and the second set of components lie between the bonding pad and an opposing edge of the die. The bonding pad is for receiving or transmitting one or more signals via the first and second conductors. At least one lead frame finger extends to an edge of the die but does not overlie the die. A bonding wire connects the at least one finger to the bonding pad.

17 Claims, 3 Drawing Sheets

US 6,653,672 B1

SEMICONDUCTOR DIE PAD PLACEMENT AND WIRE BOND

FIELD OF THE INVENTION

The present invention pertains to semiconductor bonding pad placement and wire bonding for semiconductor chip packaging.

BACKGROUND OF THE INVENTION

FIG. 1 shows a first conventional semiconductor die 10 and package 12. A lead frame 14 has fingers 16 which extend to, but stop short of, the edge of the die 18. Wire bonds 20 connect conductors on the lead frame 14 to bonding pads 22 on the edge of the die 18. After encapsulating the die 10 and lead frame fingers 16 in the package 12, the fingers 16 are cut off the frame 14.

A shortcoming of a lead frame 14-wire bonding arrangement shown in FIG. 1 is that the delicate lead frame fingers 16 are not particularly stable when the die 10 is large in comparison to the package. An improved "lead frame over ship" bonding and pad placement is shown in FIG. 2. As shown, bonding pads 22 are placed away from the edge of the die 24 and are more centrally located on the die 24. This enables bonding to a lead frame 26 with fingers 28 that extend over the die 24 itself. Because the lead frame fingers 28 are longer, they contact more of the encapsulating plastic of the chip package and therefore are more stable. The improvement in stability is associated with a higher cost since longer, more delicate fingers 28 must be produced on the lead frame 26, than on the lead frame 14. Specifically, current lead over chip technology requires that the lead frame be attached to a tape prior to encapsulating the chip and lead frame in a package to provide extra stability to the long, delicate leads. The cost of the tape alone can exceed the cost of certain integrated circuits (such as memories) themselves. Therefore, the pad-placement-wire bonding technique shown in FIG. 2 is preferably only used for high cost chips that require the added lead frame finger 28 stability associated with the lead frame 26.

FIG. 3 shows an integrated circuit device 30. The components of the integrated circuit device 30 can be divided into interface components and functional components. Functional components are those circuits and circuit elements that contribute to the functioning of the integrated circuit device 30, such as registers, phase-locked loops, storage cells, row and column decoders, precharge circuits, arithmetic logic circuits, clock circuits, analog to digital converters, etc. Interface components are circuits and circuit elements that are provided merely to interface the integrated circuit device 30 to external circuits and to prevent the integrated circuit device 30 from damaging electrical events, such as input buffers, output buffers and ESD protection circuits. Interface components can further be distinguished from functional components by noting that their primary function is to interface the input or output signals between the integrated circuit device 30 and external devices in a protected manner. Interface components otherwise contribute little or nothing to the function to be performed by the integrated circuit device 30 on the input or output signals.

The integrated circuit device 30 has multiple banks, e.g., four banks 31, 32, 33 and 34. Each bank 31–34 contains functional components that output signals onto, or receive inputted signals from, (or both output signals onto and receive signals from) one or more conductors 35. For sake of convenience, these conductors 35 are referred to herein as IO lines although they can be output lines, input lines or both output and input lines. Each IO line 35 is connected at one end to one or more interface components (not shown), wherein at least one of these interface components, in turn, is connected to a bonding pad 36. In the integrated circuit 30, the maximum length of IO line 35 over which a signal originating in bank 31 or 34 must propagate is approximately L. However, the maximum length of IO line 35 over which a signal originating in bank 32 or 33 must propagate is approximately 2L, i.e., twice as much. As can be appreciated, this disparity in propagation distance is more pronounced in integrated circuits with more than four banks.

The IO line 35 has a finite impedance and the bonding pad 36 has a finite capacitance C. The resistance experienced by a signal propagating on the IO line 35 is proportional to its length. Thus, signals originating in banks 31 or 34 will be transmitted over a path of IO line 35 having approximately one half of the resistance (and impedance) than signals originating in banks 32 or 33 and transmitted over IO line 35. As is known, the RC signal propagation delay will therefore be greater (i.e., about twice as long) for signals originating from banks 32 and 33 in comparison to signals originating from banks 31 and 34. This is undesirable in certain integrated circuits 30, such as RAMs, ROMs, PALs, PLAs, PROMs, EEPROMs, FPGAs, etc. because the cycle time must be long enough to enable signals to propagate on the longest delay path.

It is an object of the present invention to overcome the disadvantages of the prior art.

SUMMARY OF THE INVENTION

This and other objects is achieved according to the present invention. According to one embodiment, a semiconductor device is provided comprising a die. A first set of plural components, other than interface components, are located on the die surface. A first conductor located on the die surface connects to each component of the first set. A second set of plural components, other than interface components, are located on the die surface. A second conductor located on the die surface connects to each component of the second set. A bonding pad is located on the die surface such that the first set of components lie between the bonding pad and an edge of the die and the second set of components lie between the bonding pad and an opposing edge of the die. The bonding pad receives or transmits one or more signals via the first and second conductors. At least one lead frame finger extends to an edge of the die but does not overlie the die. A bonding wire connects the at least one finger to the bonding pad.

DETAILED DESCRIPTION OF THE INVENTION

The invention is illustrated herein using an SDRAM or synchronous dynamic random access memory. However, the invention is applicable to other types of integrated circuits, most notably those with multiple array organized banks such as SRAMs, DRAMs, ROMs, PROMs, EPROMs, EEPROMs, PLAs, FPLAs, PALs, PGAs, FPGAs, etc.

Figure 4:
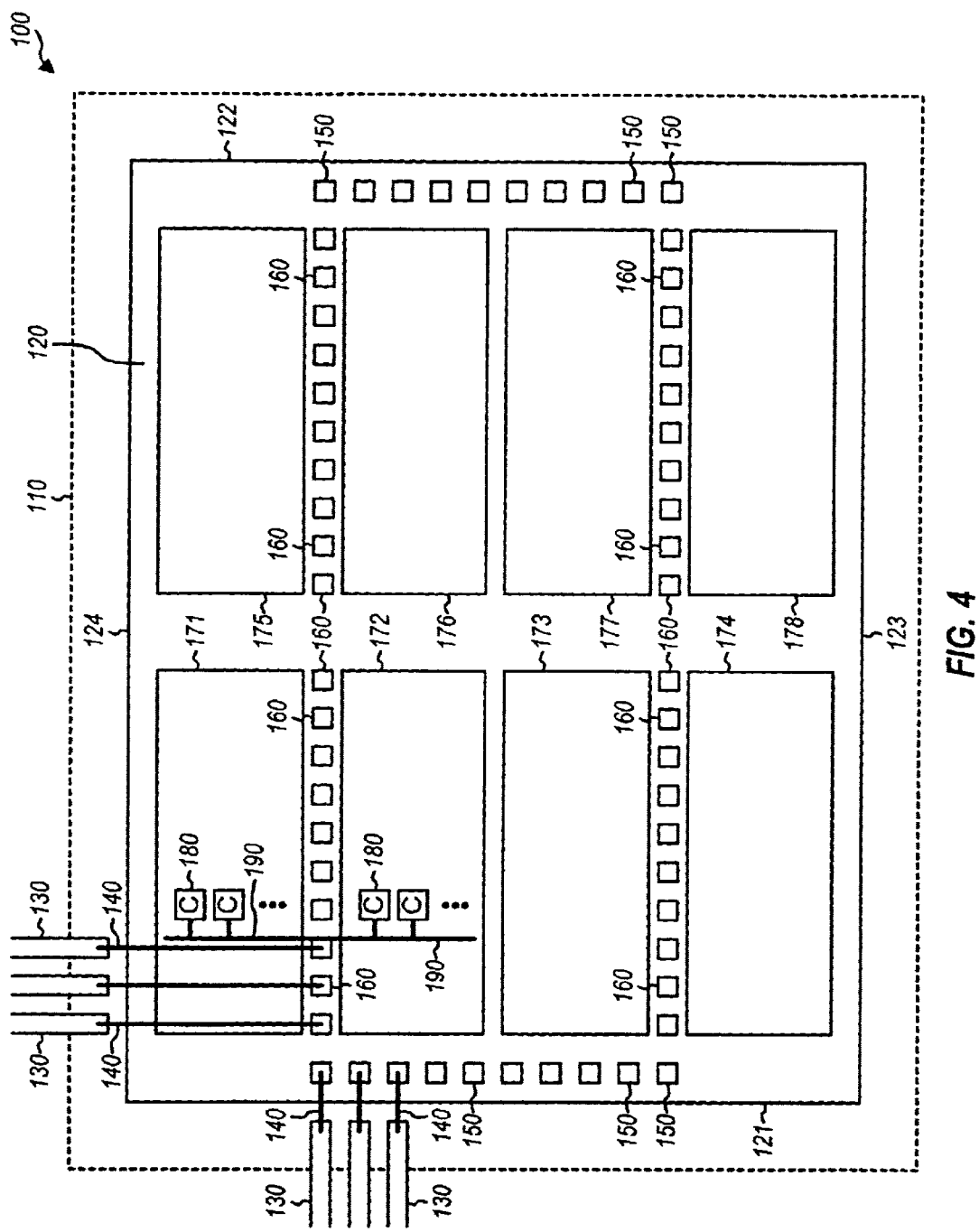
FIG. 4 shows an integrated circuit according to an embodiment of the present invention.

FIG. 4 shows a semiconductor device 100 according to the present invention. The semiconductor device has a packaging 110, a die 120, lead frame fingers 130 (initially formed from a lead frame), bonding wires 140, bonding pads 150 and 160, banks 171–178 of functional components 180 and IO lines 190 to which such functional components 180 are connected. In the device 100 according to the invention, eight banks 171–178 are shown arranged into a two dimensional array on the surface of the die 120. Each bank 171, 172, 173, 174, 175, 176 or 178 illustratively is a two-dimensional array of components 180. Illustratively, each component 180 is an SDRAM storage cell.

The semiconductor device 100 shown in FIG. 4 has a ring of bonding pads 150 and 160 arranged in a ring-like pattern on the surface of the die 120. Conventional pads 150 are shown at the left and right edges 121, 122 of the die 120. Pads 160 according to the invention are provided between pairs of banks, e.g., bank pairs (171,172), (173, 174), (175,176) or (177,178). The pads 160 form two rows extending between the edges 121 and 122 of the die 120; one row lying adjacent to banks 171, 172, 175 and 176 and one row lying adjacent to banks 173, 174, 177 and 178.

Each pad 160 according to the invention is connected to multiple IO lines 190. Illustratively, each pad is connected to respective IO lines 190 via interface components (not shown) such as an input buffer, an output buffer, a bidirectional buffer, and/or an ESD protection circuit. One of the IO lines 190 connects multiple functional components 180 in a column of the first bank of the pair, e.g., bank 171 of bank pair (171, 172), which bank 171 lies between the pad 160 and one of the edges, e.g., edge 124. Another one of the IO lines 190 connects multiple functional components 180 in a column of the second bank of the pair, e.g., bank 172, of bank pair (171, 172) which bank 172 lies between the pad 160 an opposing edge, e.g., edge 123 (which is opposite to edge 124). Note that it is possible for a pad 160 according to the invention to be at a edge, e.g., 121 or 122, so long as multiple functional components to which the pad 160 connects lie between the pad 160 and each of two edges, e.g., 123 and 124, orthogonal to the edge 121 or 122 to which the pad 160 is adjacent. Preferably, the pad 160 is separated from the nearest one of the two edges 123 or 124 by at least ⅓ of the die 120 (i.e., a portion of the die having the same width as edge 123 or 124 and at least ⅓ the length of the edge 121 or 122). The multiple functional components 180 of one of the sets is located on this separating portion of at least ⅓ of the die 120.

Lead fingers 130 extend towards, but do not overlie, i.e., end before reaching, the edges 121, 122, 123 and 124 of the die 120. Fingers 130 that connect to the pads 160 are shown as being located outside, but nearest, one of the edges from which the pad 160 is separated from by one or more of the banks 171–178, e.g., edge 124. In such a case, long bonding wires 140 may be necessary to connect the fingers at the edge to pads 160. It is also possible to bond one or more of the pads 160 to one of the orthogonal edges 121 or 122, depending on the relative placement of other pads 150.

Figure 1:
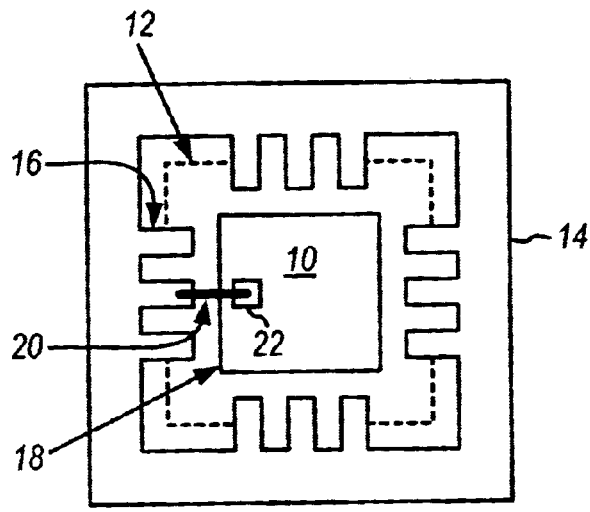
FIG. 1 shows a conventional lead frame connection to a die.
Figure 2:
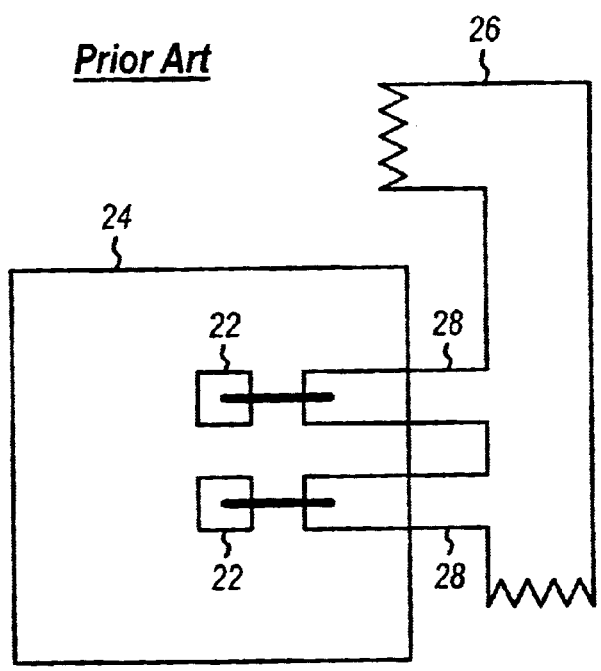
FIG. 2 shows a conventional lead frame over chip connection to a die.
Figure 3:
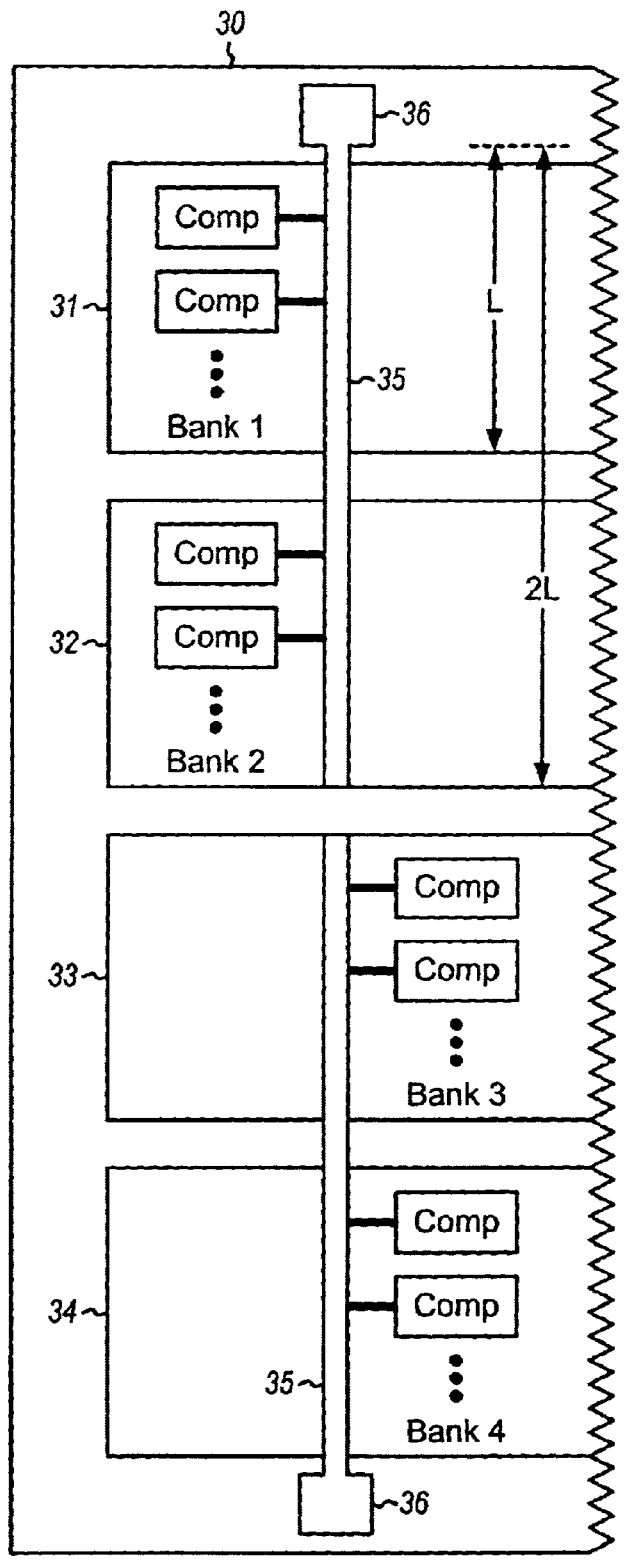
FIG. 3 shows a conventional bank architecture for an integrated circuit.

Compare the average conductor length in pairs of banks connected to a single pad, e.g., banks 31 and 32 of FIG. 3 versus banks 171 and 172 of FIG. 4. The maximum length of conductor 35 between pad 36 and bank 31 is one bank width L and the maximum length of conductor 35 between pad 36 and bank 32 is two bank widths or 2L. Thus, the architecture of FIG. 3 must be designed for the worst case access time, namely, for signals carried between the pad 36 and components in bank 32 over a conductor of length 2L. Thus, the architecture of FIG. 4 may be designed for an access time of approximately one half of that of FIG. 3. This provides a dramatic improvement in operating speed. In addition, note that the average access time between the two banks is far from equal—the access of components in bank 32 is on average about twice the access time of components in bank 31. On the other hand, the maximum length of conductor 190 between pad 160 and bank 171 is the same as that between pad 160 and bank 172, namely, one bank width L. These conductors 190 have approximately the same RC propagation delay and therefore the average access time between banks 171 and 172 is approximately the same.

Of course, pad 160 patterns other than those shown in FIG. 4 are possible. For instance, a single row of pads 160 additionally or alternatively could have been placed in the column direction between edges 123 and 124, which separates banks 171–174 from 175–178. Also, pads 150 may be omitted if they are not need. Note that pads 160 according to the invention are provided for banked components and traditional edge pads 150 are provided for other functional components. Other choices include traditional edge pads 150 for banked components and inventive pads 160 for other functional components or only inventive pads 160 for all functional components whether or not they are banked. Lastly, the choice of eight banks and a 4×2 array is somewhat arbitrary. The present invention can be used for any number of banks greater than 1 arranged in one or two dimensions with a variety of numbers of rows and columns. Furthermore, the use of "banks" may be dispensed with. In addition, the components may connected on the same IO line 190 may be the same or different.

The above discussion is intended to be merely illustrative of the invention. Those having ordinary skill in the art may devise numerous alternative embodiments without departing from the spirit and scope of the following claims.

What is claimed is:

1. A semiconductor chip comprising:
   a die having a surface, a first edge, and a second edge opposite from said first edge,
   a first bonding pad formed on said die surface between said first and second edges of said die, said first bonding pad having a first side and a second side opposite from said first side,
   a first set of plural components, other than interface components, located on said die surface between said first edge of said die and said first side of said first bonding pad,
   a first conductor located on said die surface between said first edge of said die and said first side of said bonding pad, said first conductor coupled to each component in said first set,
   a second set of plural components, other than interface components, located on said die surface between said second edge of said die and said second side of said first bonding pad,
   a second conductor located on said die surface between said second edge of said die and said second side of said first bonding pad, said second conductor coupled to each component in said second set, said first and second conductors operatively coupled to said first bonding pad from said first and second sides, respectively, of said first bonding pad,
   a lead frame finger extending to an edge of said die but not overlying said die, and
   a bonding wire coupling said finger to said first bonding pad.

2. The semiconductor chip of claim 1, further comprising:
a second bonding pad formed on said die surface between said second side of said first bonding pad and said second edge of said die, said second bonding pad having a first side and a second side opposite from said first side,
a third set of plural components, other than interface components, located on said die surface between said second side of said first bonding pad and said first side of said second bonding pad,
a third conductor located on said die surface between said second side of said first bonding pad and said first side of said second bonding pad, said third conductor coupled to each component in said third set,
a fourth set of plural components, other than interface components, located on said die surface between said second side of said second bonding pad and said second edge of said die,
a fourth conductor located on said die surface between said second side of said second bonding pad and said second edge of said die, said fourth conductor coupled to each component in said fourth set, said third and fourth conductors operatively coupled to said second bonding pad from said first and second sides, respectively, of said second bonding pad,
a second lead frame finger extending to an edge of said die but not overlying said die, and
a second bonding wire coupling said second finger to said second bonding pad.

3. The semiconductor chip of claim 2, wherein said second bonding pad is linearly aligned with said first bonding pad so that said second bonding pad is located between said first bonding pad and said second edge of said die.

4. The semiconductor chip of claim 1, wherein said first and second conductors have lengths selected to equalize an RC propagation delay of one or more signals between said first bonding pad and said first and second sets of components.

5. The semiconductor chip of claim 1, wherein said first and second sets of components have approximately equal access times from said first bonding pad.

6. The semiconductor chip of claim 1, wherein said first and second conductors are transverse to said first and second edges of said die.

7. The semiconductor chip of claim 1, wherein said first conductor traverses substantially a length between said first edge of said die and said first side of said first bonding pad, and wherein said second conductor traverses substantially a length between said second edge of said die and said second side of said first bonding pad.

8. A semiconductor device comprising:
a die having a surface,
first and second banks located on said die surface, each bank having plural components arranged into a two-dimensional array of plural rows and plural columns, said first and second banks being located on said die surface between first and second opposing edges of said die,
a first set of plural conductors located on said die surface, each conductor in said first set coupling plural components located in a particular column of said first bank,
a second set of plural conductors located on said die surface, each conductor in said second set coupling components located in a particular column of said second bank,
a plurality of bonding pads, one bonding pad for each pair of conductors, with one conductor being from said first set and one conductor being from said second set, said plurality of bonding pads aligned in a row on said die surface and located between said first and second banks, each of said bonding pads operatively coupled to a respective conductor in said first set from a first side of said bonding pad and to a respective conductor in said second set from a second and opposing side of said bonding pad,
a plurality of lead frame fingers, one lead finger for each of said bonding pads, said fingers extending to an edge of said die but not overlying said die, and
a plurality of bonding wires, one bonding wire corresponding to each finger and coupling said corresponding finger to a respective bonding pad.

9. The semiconductor device of claim 8, wherein said semiconductor device is a memory device and each of said components of said first and second banks is a storage cell.

10. The semiconductor device of claim 8, wherein said first and second sets of plural conductors are transverse to said first and second opposing edges of said die.

11. A semiconductor device comprising:
a die having a surface,
first and second banks located on said die surface, each bank having plural components arranged into a two-dimensional array of plural rows and plural columns, said first and second banks being located on said die surface between first and second opposing edges of said die,
a first set of plural conductors located on said die surface, each conductor in said first set coupling plural components located in a particular column of said first bank,
a second set of plural conductors located on said die surface, each conductor in said second set coupling components located in a particular column of said second bank, and
a plurality of bonding pads, one bonding pad for each pair of conductors, with one conductor being from said first set and one conductor being from said second set, said plurality of bonding pads aligned in a row on said die surface and located between said first and second banks, each of said bonding pads operatively coupled to a respective conductor in said first set from a first side of said bonding pad and to a respective conductor in said second set from a second and opposing side of said bonding pad,
wherein said conductors of said first and second sets are dimensioned and arranged such that an RC propagation delay of said one or more signals on said respective conductor of said first set approximately equals an RC propagation delay of said one or more signals on said respective conductor of said second set.

12. A semiconductor device comprising:
four or more rows of banks, each row of banks including one or more banks, each bank including a plurality of components;
two or more rows of bonding pads, each row of bonding pads located between, and associated with, a respective pair of rows of banks; and
first and second sets of conductors for each row of bonding pads, the first and second sets of conductors coupling the row of bonding pads to components within banks in first and second rows, respectively, in the pair of rows of banks associated with the row of bonding pads, each bonding pad operatively coupled to one conductor in said first set from a first side of said bonding pad and to one conductor in said second set from a second and opposing side of said bonding pad.

13. The semiconductor device of claim 12, further comprising:
   a plurality of lead frame fingers coupled to the two or more rows of bonding pads.

14. The semiconductor device of claim 13, wherein the plurality of lead frame fingers extend to, but do not overly, an edge of a die on which the rows of banks are disposed.

15. The semiconductor device of claim 12, wherein each conductor traverses a length of one bank.

16. The semiconductor device of claim 12, wherein each bank includes a plurality of memory cells.

17. The semiconductor device of claim 12, wherein the first and second sets of conductors for each row of bonding pads are dimensioned and arranged to provide approximately equal RC propagation delay for signals transmitted on the conductors.

* * * * *